United States Patent
Nakasuji

(10) Patent No.: US 6,608,317 B1
(45) Date of Patent: Aug. 19, 2003

(54) CHARGED-PARTICLE-BEAM (CPB)-OPTICAL SYSTEMS WITH IMPROVED SHIELDING AGAINST STRAY MAGNETIC FIELDS, AND CPB MICROLITHOGRAPHY APPARATUS COMPRISING SAME

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 179 days.

(21) Appl. No.: 09/715,442

(22) Filed: Nov. 16, 2000

(30) Foreign Application Priority Data

Nov. 16, 1999 (JP) .............................. 11-325460

(51) Int. Cl.[7] .............................. G21K 5/10; H01J 37/08
(52) U.S. Cl. .............................................. 250/492.22
(58) Field of Search ...................... 430/30; 250/492.2, 250/492.21, 492.22, 492.23

(56) References Cited

U.S. PATENT DOCUMENTS 4,859,856 A * 8/1989 Groves et al. ....... 250/396 ML
4,985,634 A * 1/1991 Stengl et al. ............ 250/492.2
5,569,930 A * 10/1996 Imai ........................... 250/548

* cited by examiner

Primary Examiner—John R. Lee
Assistant Examiner—James J Leybourne
(74) Attorney, Agent, or Firm—Klarquist Sparkman LLP

(57) ABSTRACT

Charged-particle-beam (CPB)-optical systems, and CPB microlithography systems including such CPB-optical systems, are disclosed that exhibit improved shielding against external stray magnetic fields. For example, the systems and apparatus exhibit improved shielding against stray magnetic fields from peripheral conductors or moving conductors, such as linear motors used to drive the reticle stage and/or substrate stage. To such end, a magnetic shield can be attached to the downstream-facing edge of a vacuum wall covering the downstream-facing surface of the wafer-side projection lens. Similarly, a magnetic shield can be attached to the upstream-facing edge of a vacuum wall covering the upstream-facing surface of the reticle-side projection lens. The axis-facing surface of the magnetic shield can have a conical profile, and the magnetic shield can be situated just outside a zone for passage of a light beam for a Z-position sensor.

26 Claims, 4 Drawing Sheets

CHARGED-PARTICLE-BEAM (CPB)-OPTICAL SYSTEMS WITH IMPROVED SHIELDING AGAINST STRAY MAGNETIC FIELDS, AND CPB MICROLITHOGRAPHY APPARATUS COMPRISING SAME

FIELD OF THE INVENTION

This invention pertains to microlithography (transfer of an image of a pattern, defined by a reticle or mask, to a sensitive substrate using an energy beam). Microlithography is a key technique used in the manufacture of microelectronic devices such as integrated circuits, displays, and the like. More specifically, this invention pertains to microlithography performed using a charged particle beam such as an electron beam or ion beam. Even more specifically, the invention pertains to shielding components of the charged-particle-beam (CPB) optical system, as used in CPB microlithography apparatus, against external magnetic fields such as stray magnetic fields generated from any of various sources such as the linear motors that actuate the stage on which the substrate is mounted during exposure.

BACKGROUND OF THE INVENTION

Charged-particle-beam (CPB) microlithography is an attractive candidate technique for achieving better pattern-transfer resolution than obtainable using current optical microlithography. One type of CPB microlithography apparatus, termed a "reduction" transfer apparatus, forms a demagnified image of a highly dense and extremely fine pattern, defined on a reticle, on a sensitive substrate (e.g., resist-coated wafer). In view of the required extremely high accuracy of pattern transfer performed using a reduction CPB microlithography apparatus, external stray magnetic fields must be prevented from affecting the charged particle beam. Examples of such fields include magnetic fields generated by electrical current flowing through peripheral wires or movement of conductive bodies outside the CPB-optical system of the apparatus. A notable source of such fields is the linear motors used to provide the reticle stage and wafer stage with movability in the X- and Y-directions.

Several conventional techniques have been proposed and implemented to prevent the effects of stray magnetic fields. One technique involves lining the walls of a room, in which the CPB microlithography apparatus is located, with a material having high permeability (e.g., "Supermalloy" or Permalloy C™, which are ferromagnetic materials containing about 75% Ni). The lining magnetically shields the interior of the room from external magnetic fields. Unfortunately, with this technique, it is difficult to achieve a high magnetic-shielding ratio (ratio of internal magnetic field to external magnetic field). For example, in a room having dimensions of length 4 m, width 4 m, and height 2 m, lining the walls with Supermalloy that is 2 mm thick provides a magnetic-shielding ratio of only about ⅓. Also, creating a room having magnetically shielded walls in this manner is prohibitively costly in many instances.

A second technique involves covering the exterior of a column containing the CPB-optical system with a high-permeability material. Unfortunately, this technique provides little protection against stray magnetic fields generated by linear motors and the like situated inside the column and used to drive the reticle stage and substrate stage. These linear motors normally are disposed very close to CPB-optical components located inside the column, so stray magnetic fields generated by them can have a significant effect on magnetic fields generated by the CPB-optical components.

SUMMARY OF THE INVENTION

In view of the shortcomings of the prior art as summarized above, an object of the invention is to provide charged-particle-beam (CPB) microlithography apparatus and methods that achieve improved shielding against external magnetic fields, including stray magnetic fields generated by nearby linear motors and the like used to actuate the reticle and substrate stages.

To such ends, and according to a first aspect of the invention, CPB microlithography apparatus are provided. An embodiment of such an apparatus comprises an illumination-optical system, a reticle stage, an imaging-optical system, and a substrate stage. The illumination-optical system is situated on an optical axis and configured to illuminate a region of a reticle, defining a pattern to be transferred to a sensitive substrate, with a charged particle illumination beam. The reticle stage is situated and configured to hold the reticle as the reticle is being illuminated by the illumination-optical system, wherein charged particles of the illumination beam passing through the illuminated region of the reticle constitute a patterned beam. The imaging-optical system is situated on the optical axis and configured to receive the patterned beam and project a demagnified focused image, on a sensitive substrate, of the illuminated region of the reticle. The substrate stage is situated and configured to hold the substrate as the patterned beam is projecting the image onto the substrate. The imaging-optical system further comprises a reticle-side electromagnetic projection lens and a wafer-side electromagnetic projection lens situated axially downstream of the reticle-side projection lens. The wafer-side projection lens includes a first magnetic shield having a first axis-facing surface that is rotationally symmetrical about the axis. The first magnetic shield is situated between a downstream-facing surface of the wafer-side projection lens and the substrate stage.

Hence, the first magnetic shield in this embodiment is provided between the wafer-side projection lens and the substrate stage so as to shield against stray magnetic fields extending upward from the direction of the substrate stage. For example, if the substrate stage is driven using linear motors, stray magnetic fields generated from such motors are blocked by the first magnetic shield. Desirably, the first magnetic shield comprises a ferromagnetic substance. Such a substance can alter the magnetic field produced by the wafer-side projection lens. However, since the first magnetic shield is axially symmetrical, and since the entire lens magnetic field includes the first magnetic shield, lens aberrations produced by the first magnetic field can be cancelled using a deflector associated with the wafer-side projection lens.

In the foregoing apparatus, a space between the wafer-side projection lens and the substrate stage can be provided that defines a zone in which a beam from a grazing-incidence-type substrate-height measurement device propagates to and from the substrate between the wafer-side projection lens and the substrate. In such a configuration, the first magnetic shield of the wafer-side projection lens defines a downstream-facing surface that is situated adjacent to but outside the zone.

The apparatus embodiment also can include a liner tube extending along the optical axis and having a downstream end. This configuration can include a rotationally symmetrical "lower" first vacuum wall having an inside-diameter edge and a peripheral edge. The inside-diameter edge is attached circumferentially to the downstream end of the liner tube and extends radially between the wafer-side projection lens and the substrate stage. The configuration also can include a rotationally symmetrical "lower" second vacuum wall having a cylindrical body portion extending upstream in an axial direction outside the wafer-side projection lens and a downstream edge attached circumferentially to the peripheral edge of the lower first vacuum wall. The first magnetic shield can extend along a downstream-facing surface of the lower first vacuum wall from the peripheral edge toward the optical axis.

The apparatus embodiment also can include a deflector situated radially inwardly of the wafer-side projection lens. In this configuration, a cylindrical deflector shield can extend in an axial direction between the deflector and the wafer-side projection lens, wherein the first magnetic shield has an inside-diameter edge having a diameter that is larger than an inside diameter of the deflector shield. The deflector shield desirably is a ferrite stack.

The first axis-facing surface of the first magnetic shield can be conical in profile. Also, the first magnetic shield can have a multilayer structure including a non-magnetic body layer sandwiched between two ferromagnetic layers.

In the apparatus embodiment, the reticle-side projection lens can include a second magnetic shield having a second axis-facing surface that is rotationally symmetrical about the optical axis. In this configuration the second magnetic shield is situated between an upstream-facing surface of the reticle-side projection lens and the reticle.

A space between the reticle-side projection lens and the reticle can define a zone in which a beam from a grazing-incidence-type reticle-height measurement device propagates to and from the reticle between the reticle-side projection lens and the reticle. In such a configuration, the second magnetic shield defines an upstream-facing surface that is situated adjacent to but outside the zone.

The extent to which a stray magnetic field causes a shift in the position of an image as formed on the substrate is proportional to the distance between the location of the magnetic field and the substrate. Whenever the stray magnetic field is located at the sensitive surface of the substrate, the distance is zero, and no shift occurs. Hence, while allowing an unobstructed zone for the beam from the grazing-incidence-type reticle-height measurement device, the first magnetic shield should be situated as close as possible to the zone so as to situate the first magnetic shield as close as possible to the substrate surface.

Further with respect to this apparatus embodiment, the liner tube can have an upstream end. The reticle-side projection lens also can include a rotationally symmetrical "upper" first vacuum wall and a rotationally symmetrical "upper" second vacuum wall. The upper first vacuum wall can include an inside-diameter edge and a peripheral edge. The inside-diameter edge can be attached circumferentially to the upstream end of the liner tube and extend between the reticle-side projection lens and the reticle. The upper second vacuum wall can include a cylindrical body portion extending downstream in an axial direction outside the reticle-side projection lens and an upstream edge attached circumferentially to the peripheral edge of the upper first vacuum wall. The second magnetic shield can extend along an upstream-facing surface of the upper first vacuum wall, from the peripheral edge toward the optical axis.

This apparatus configuration also can include a second deflector situated radially inwardly of the reticle-side projection lens. In this configuration, a cylindrical second deflector shield can be provided, extending in an axial direction between the second deflector and the reticle-side projection lens. The second magnetic shield can have an inside-diameter edge having a diameter that is larger than an inside diameter of the second deflector shield.

The second deflector shield desirably is a ferrite stack. Also, the second magnetic shield can have a multilayer structure including a non-magnetic body layer sandwiched between two ferromagnetic layers.

According to another embodiment, a CPB microlithography apparatus according to the invention comprises an illumination-optical system, a reticle stage, and a substrate stage as summarized above. The imaging-optical system comprises a reticle-side electromagnetic projection lens and a wafer-side electromagnetic projection lens situated axially downstream of the reticle-side projection lens. The reticle-side projection lens includes a second magnetic shield having a second axis-facing surface that is rotationally symmetrical about the optical axis. The second magnetic shield is situated between an upstream-facing surface of the reticle-side projection lens and the reticle.

In this apparatus embodiment, the second magnetic shield is situated between the upstream-facing surface of the reticle-side projection lens and the reticle stage. As a result, the region between the reticle and the reticle-side projection lens that heretofore was vulnerable to stray magnetic fields now can be shielded. For example, if the reticle stage is driven using linear motors, shielding is achieved against stray magnetic fields generated from such motors.

In this configuration, a space can be provided between the reticle-side projection lens and the reticle. The space defines a zone in which a beam from a grazing-incidence-type reticle-height measurement device propagates to and from the reticle between the reticle-side projection lens and the reticle. The second magnetic shield defines an upstream-facing surface that desirably is situated adjacent to but outside the zone.

Hence, as with a first magnetic shield placed on the substrate side, the second magnetic shield situated between the reticle-side projection lens and the reticle desirably is situated as close to the zone as possible to prevent stray magnetic fields from shifting the position of the imaging beam on the substrate.

This embodiment also can include a liner tube extending along the optical axis and having an upstream end. A rotationally symmetrical "upper" first vacuum wall having an inside-diameter edge and a peripheral edge can be provided, wherein the inside-diameter edge is attached circumferentially to the upstream end of the liner tube and extends between the reticle-side projection lens and the reticle. Also, a rotationally symmetrical "upper" second vacuum wall can be provided, having a cylindrical body portion extending downstream in an axial direction outside the reticle-side projection lens, and an upstream edge attached circumferentially to the peripheral edge of the upper first vacuum wall. The second magnetic shield desirably extends along an upstream-facing surface of the upper first magnetic wall from the peripheral edge toward the optical axis.

This apparatus embodiment also can include a second deflector situated radially inwardly of the reticle-side projection lens. In this configuration, a cylindrical second deflector shield (desirably made of a ferrite stack) can be provided, extending in an axial direction between the second deflector and the reticle-side projection lens. The second magnetic shield desirably has an inside-diameter edge having a diameter that is larger than an inside diameter of the second deflector shield. Such a configuration is useful in preventing the magnetic field generated by the second deflector from causing eddy currents to flow in the magnetic shields, thereby prevent delays in the deflection time constant of the second deflector.

The foregoing and additional features of the invention will be more readily apparent from the following detailed description, which proceeds with reference to the accompanying drawings.

DETAILED DESCRIPTION

The invention is described below in the context of representative embodiments. However, it will be understood that the invention is not limited to those embodiments. Also, the invention is described in the context of using an electron beam as an exemplary charged particle beam. However, it will be understood that the general principles set forth herein are applicable with equal facility to other types of charged particle beams, such as an ion beam.

Figure 3:
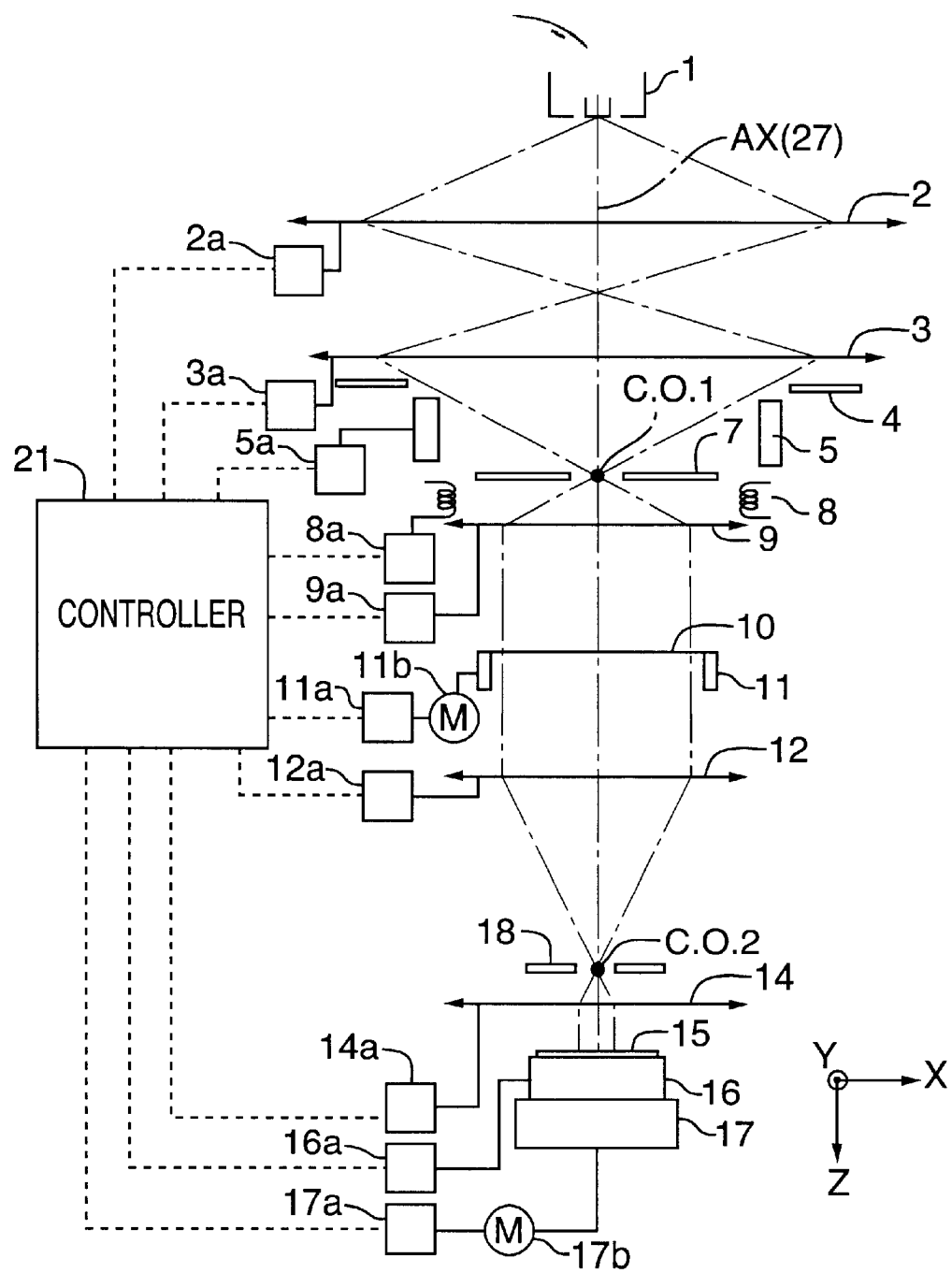
FIG. 3 is an elevational schematic diagram showing certain structural and optical features of a charged-particle-beam (CPB) microlithography apparatus according to the invention, including components used for beam focusing and control.

Reference is made first to FIG. 3, depicting certain general aspects of an electron-beam microlithography apparatus used for step-and-repeat projection-transfer of a pattern from a reticle to a suitable substrate (e.g., semiconductor wafer). FIG. 3 especially shows certain details of the "electron-optical system" of the apparatus, including the focusing system and a system for controlling operation of the electron-optical system.

An electron gun 1 is situated at the extreme upstream end of the electron-optical system. The electron gun 1 emits an electron beam that propagates downstream of the electron gun generally in the direction of an "optical axis" AX (i.e., Z-direction). The electron beam propagating from the electron gun 1 to a reticle 10 is termed an "illumination beam," and the portion of the electron-optical system arranged along the axis AX between the electron gun 1 and the reticle 10 is termed the "illumination-optical system." The illumination-optical system comprises two condenser lenses 2, 3 that converge the illumination beam at a crossover C.O.1 situated at a blanking aperture 7.

A "beam-shaping" aperture 4 (generally rectangular in profile) is situated downstream of the second condenser lens 3. The beam-shaping aperture 4 transmits only a portion of the illumination beam sufficient to illuminate a single subfield (exposure unit) of the pattern defined on the reticle 10. For example, in this embodiment, the beam-shaping aperture 4 trims the illumination beam to a square transverse profile with dimensions slightly greater than 1 mm per side to illuminate a (1 mm)-square subfield on the reticle 10. An image of the beam-shaping aperture 4 is formed by an illumination lens 9 on the surface of the reticle 10.

A blanking deflector 5 is situated either downstream or upstream of the beam-shaping aperture 4. The blanking deflector 5 deflects the illumination beam as required to be incident on a non-transmissive portion of the blanking aperture 7. Whenever the illumination beam is "blanked" in this manner, it does not pass through the blanking aperture 7 and thus is not incident on the reticle 10.

A subfield-selection deflector 8 is situated downstream of the blanking aperture 7. The subfield-selection deflector 8 mainly scans the illumination beam left and right in FIG. 3 (i.e., the X-direction) so as to illuminate the subfields on the reticle 10 in a sequential manner. The magnitude of lateral beam deflection imparted by the subfield-selection deflector 8 is within the optical field of the illumination-optical system.

Another component of the illumination-optical system is the illumination lens 9 situated downstream of the deflector 8. The illumination lens 9 collimates the illumination beam before the beam is incident on the reticle 10. The illumination lens 9 also forms the image of the beam-shaping aperture 4 on the reticle 10.

It will be understood from the foregoing that the optical components of the illumination-optical system guide and shape the illumination beam as the beam propagates from the electron gun 1 to the reticle 10.

The reticle 10 is depicted in FIG. 3 as a single subfield located on the optical axis AX. However, it will be understood that an actual reticle contains a plurality (typically many thousands) of subfields extending in the X-Y plane perpendicular to the optical axis AX. The reticle 10 typically defines the entire pattern for a layer of a chip (die) to be formed on a substrate ("wafer") 15.

As noted above, the subfield-selection deflector 8 deflects the illumination beam laterally within the optical field of the illumination-optical system. To allow exposure of subfields located outside the optical field, the reticle 10 is mounted to a reticle stage 11 that is movable in the X- and Y-directions. This movement is imparted by respective linear motors denoted generally by the reference numeral 11b.

Situated below the reticle 10 (between the reticle 10 and the substrate 15) are various components of an "imaging-optical system," described below. As particles of the illumination beam are transmitted through an illuminated subfield on the reticle 10, they become a "patterned beam" (also termed an "imaging beam") that passes through the imaging-optical system to the wafer 15. The patterned beam carries an image of the illuminated subfield. The imaging-optical system includes a first (or reticle-side) electromagnetic projection lens 12 and a second (or wafer-side) electromagnetic projection lens 14. As the patterned beam passes through the projection lenses 12, 14, the image carried by the beam is "demagnified," projected onto, and formed at a predetermined location on the wafer 15. To be imprintable with the image, the upstream-facing surface of the wafer 15 is coated with a suitable resist. As the patterned beam is incident on region of the wafer surface, corresponding to the particular subfield being illuminated, a demagnified latent image of the subfield is formed at the region, thereby completing "transfer" of the image of the subfield. By "demagnified" is meant that the image as formed on the wafer 15 is smaller (typically by a "demagnification ratio"

factor 1/X, wherein X usually is 2 to 10) than the corresponding subfield on the reticle 10.

As the patterned beam propagates through the imaging-optical system, a crossover C.O.2 is formed at a point on the axis AX at which the axial distance between the reticle 10 and the wafer 15 is divided according to the demagnification ratio. A "contrast aperture" 18 normally is provided at the crossover C.O.2. The contrast aperture 18 blocks scattered particles of the patterned beam, thereby preventing the scattered particles from propagating to the wafer 15 on which the particles otherwise would expose the resist and cause blur of the images formed on the wafer.

The wafer 15 is mounted on an electrostatic wafer chuck 16 situated on a wafer stage 17 that is movable in the X- and Y-direction. This movement is imparted by respective linear motors denoted generally by the reference numeral 17b. During exposure, the reticle stage 11 and wafer stage 17 are scanned synchronously in mutually opposite directions to allow a plurality of aligned subfields in a chip pattern to be exposed sequentially. Furthermore, both stages 11, 17 are provided with respective position-measuring systems comprising laser interferometers for measuring the respective stage positions with extremely high accuracy. Hence, the position of the patterned beam as incident on the wafer 15 can be controlled with high accuracy.

Energization of each of the lenses 2, 3, 9, 12, 14 and of each of the deflectors 5, 8 is controlled by a controller 21 via individual coil power supplies 2a, 3a, 9a, 12a, 14a, and 5a, 8a, respectively. Similarly, the linear motors 11b, 17b of the reticle stage 11 and wafer stage 17, respectively, are controlled by the controller 21 via respective stage drivers 11a, 17a. Further similarly, the wafer chuck 16 is operated in a controllable manner by the controller 21 via a chuck driver 16a. Hence, by accurate stage positioning and operation of the illumination- and imaging-optical systems, the demagnified images of the reticle subfields are formed and "stitched together" accurately on the wafer 15, thereby achieving transfer of the entire chip pattern onto the wafer 15.

As well understood in the art, the electron gun 1, illumination-optical system, imaging-optical system, the reticle stage 11 and the wafer stage 17 are situated inside a vacuum chamber (not shown) that is evacuated by a vacuum pump (not shown). The vacuum chamber and electron-optical components enclosed therein is referred to as the "column."

Figure 1:
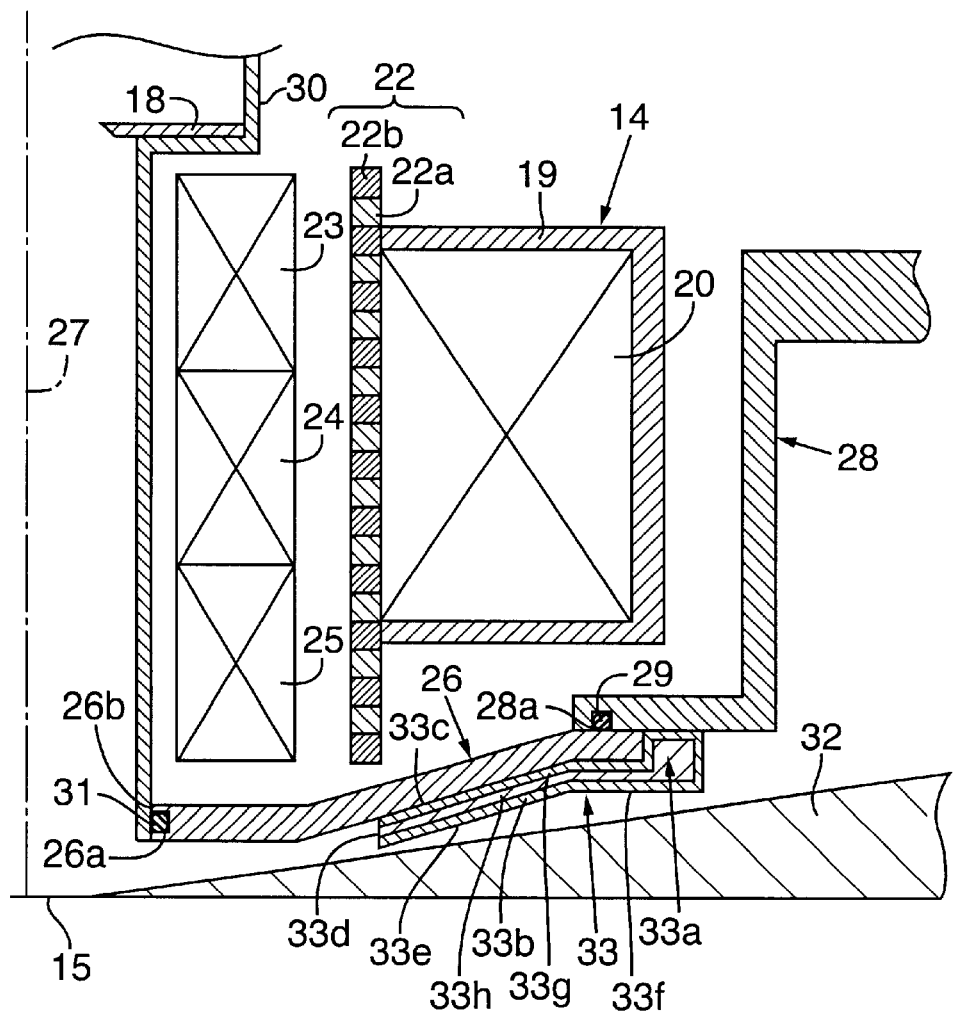
FIG. 1 is an enlarged elevational section of the lower right portion of a wafer-side electromagnetic projection lens as used in the FIG. 3 apparatus, showing components located in the vicinity of the lens.
Figure 2:
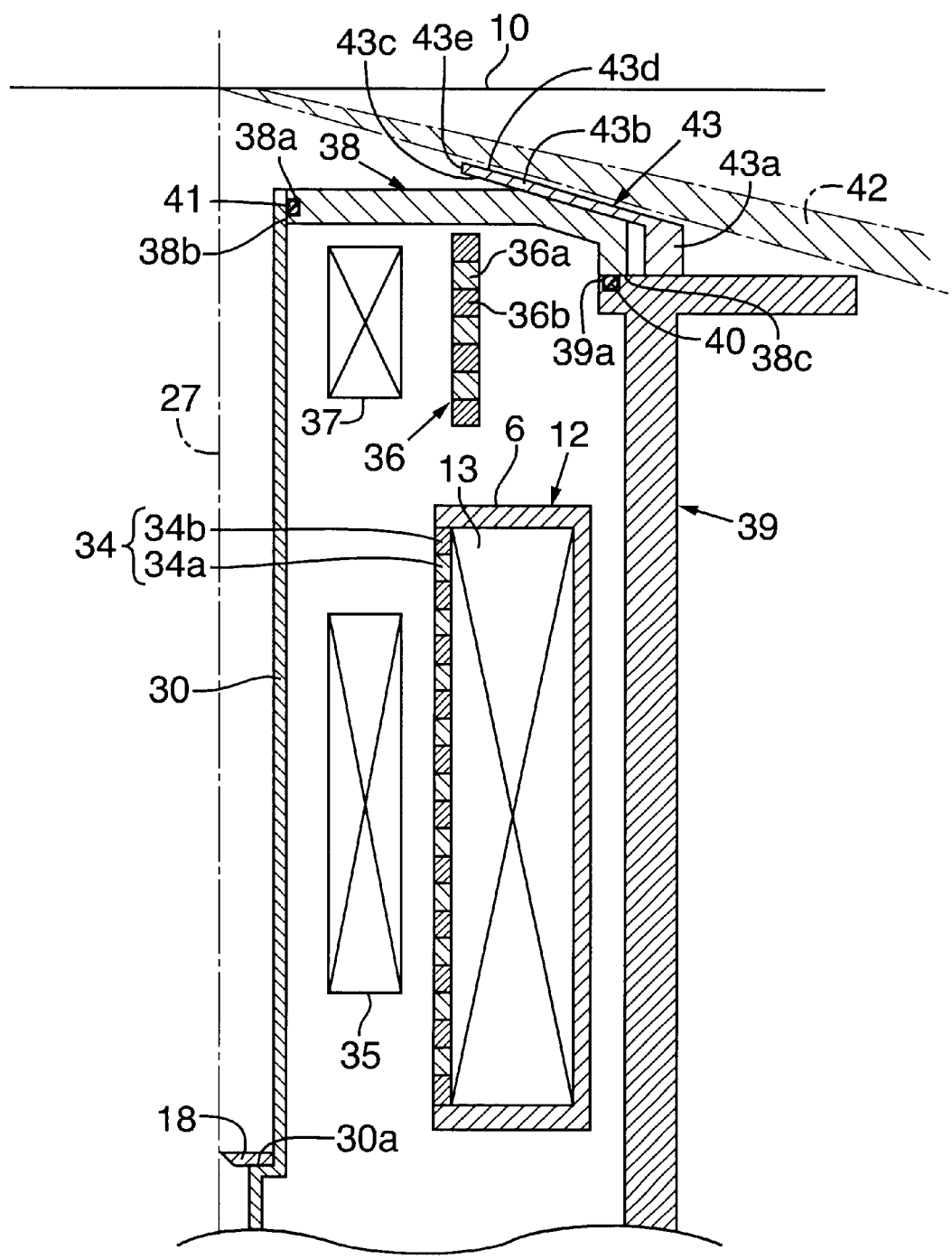
FIG. 2 is an enlarged elevational section of the upper right portion of a reticle-side electromagnetic projection lens as used in the FIG. 3 apparatus, showing components located in the vicinity of the lens.

Details of the wafer-side electromagnetic projection lens 14 and the reticle-side electromagnetic projection lens 12 are shown in FIGS. 1 and 2, respectively.

FIG. 1 is an enlarged elevational section of the lower right portion of the wafer-side projection lens 14 and its vicinity. The wafer-side projection lens 14 comprises a magnetic pole 19 that is rotationally symmetrical about the axis 27 and has a "C" radial section opening toward the axis 27. Conductive windings 20 are configured as a coil situated inside the magnetic pole 19. The magnetic pole 19 is made of a ferromagnetic material such as Permalloy or soft iron. The coil windings 20 are energized with an electrical current to cause the magnetic pole 19 to produce a magnetic field. The magnetic pole 19 also serves as a shield that blocks inward incursion of external magnetic fields.

Along the inside diameter of the magnetic pole 19 is a ferrite stack 22 comprising alternating rings of an insulator material 22a and a ferrite material 22b stacked vertically in the figure (i.e., in the direction of the optical axis 27). The ferrite stack 22 is a magnetic shield that blocks outward escape of the deflection magnetic fields produced by deflection coils 23–25 (described later). Situated radially inward of the ferrite stack 22 are the deflection coils 23–25, which function to correct aberrations and the like of the wafer-side projection lens 14. The deflection coils 23–25 are stacked in the vertical (axial) direction in the figure.

The respective downstream-facing surfaces of the wafer-side projection lens 14, of the ferrite stack 22, and of the deflection coil 25 are all "covered" by a rotationally symmetrical "lower" first vacuum wall 26. The lower first vacuum wall 26 desirably is made of an insulator material such as ceramic or plastic. A rotationally symmetrical "lower" second vacuum wall 28 extends in an upstream direction from and is attached to the "upper" surface of the peripheral edge of the lower first vacuum wall 26. The outside of the wafer-side projection lens 14 substantially is "covered" by the lower second vacuum wall 28, which desirably is made of soft iron or a material such as Permalloy or Permendur. The downstream end of the lower second vacuum wall 28 extends radially toward the axis 27 and defines a gland (groove) 28a configured to hold an elastomeric O-ring 29 or analogous sealing member. The O-ring 29 forms a circumferential seal where the lower first vacuum wall 26 contacts the lower second vacuum wall 28.

A liner tube 30 extends in the optical-axis direction (vertical direction in the figure) and is attached circumferentially to the lower first vacuum wall 26 at an inside edge 26b of the lower first vacuum wall 26. The inside edge 26b defines a ring-shaped gland (groove) 26a configured to hold an elastomeric O-ring 31 or analogous sealing member. Thus, the O-ring 31 forms a circumferential seal between the inside edge 26b of the lower first vacuum wall 26 and the downstream end of the liner tube 30.

A wafer Z-position sensor (not shown, but known in the art) is disposed to direct a light beam (and receive a reflected light beam) at a shallow angle (grazing-incidence angle) upward from the surface of the wafer 15. The incident and reflected light beams propagate within defined respective zones 32. The reflected beam is detected and processed in a manner yielding information concerning the axial height position of the wafer 15.

As a result of the configuration described above, the space located radially inward from the wafer-side projection lens 14 is shielded magnetically by the magnetic pole 19 from magnetic fields generated by electrical current flowing in conductors located outside the column, by movements of conductive bodies within or outside the column, and by movements of the linear motor 17b actuating the wafer stage 17. These various magnetic fields are termed simply herein "stray magnetic fields."

The area situated in a gap between the downstream-facing surface of the wafer-side projection lens 14 and the wafer 15 is affected easily by stray magnetic fields (generated by, e.g., the linear motor 17b) because this area is outside the effective electromagnetic lens-effect range of the wafer-side projection lens 14. If the patterned beam propagating through this area were to be affected adversely by a stray magnetic field, then the irradiation position of the patterned beam on the upstream-facing (sensitive) surface of the wafer 15 would be affected correspondingly, leading to undesired variations in exposure position on the wafer surface. The effects of stray magnetic fields can be suppressed by narrowing this gap, but some gap must be present to provide the zone 32 in which the Z-sensor light beam can propagate without obstruction.

The magnitude of variation in position of the patterned beam on the sensitive surface of the wafer 15 can be expressed as a product of the magnitude of the stray magnetic field and the axial distance from the sensitive surface of the wafer 15 to the location of the stray magnetic field. I.e., the magnitude of variation in beam position is proportional to this axial distance. Hence, if a strong stray magnetic field were present directly on the sensitive surface of the wafer 15, then the axial distance would be zero and no beam-position variation would be exhibited. But, the effect of a stray magnetic field is significant upstream from the sensitive surface. Therefore, it is important to shield against stray magnetic fields in the region from the "lower" (downstream-facing) surface of the wafer-side projection lens 14 to near the sensitive surface of the wafer 15.

In view of the above, and according to this embodiment, a first magnetic shield 33 is attached to the "lower" (downstream-facing) surface of the lower first vacuum wall 26. As discussed above, the magnitude of variation of beam position caused by a stray magnetic field is proportional to the axial distance from the sensitive surface of the wafer 15 to the location where the stray magnetic field is generated. Therefore, a shield against the stray magnetic field must function effectively from the location of the shield upstream wafer 15 to a location adjacent the sensitive surface of the wafer 15, without obstructing the zone 32 for the light beam for the Z-position sensor. Hence, in this embodiment, the first magnetic shield 33 is disposed so that a "lower" surface 33e of the first magnetic shield 33 is adjacent as close as possible to the zone 32 without obstructing the zone 32. For example, the first magnetic shield 33 is close to the zone 32 at two places in a radial direction, while maintaining a slight clearance between the first magnetic shield 33 and the zone 32.

In this embodiment, the first magnetic shield 33 is a three-layer clad structure in which a copper layer 33h is sandwiched between two ferromagnetic (e.g., Supermalloy) layers 33f, 33g that are each 0.5 µm thick. Structuring the first magnetic shield 33 in this way as a multilayer structure that includes at least two ferromagnetic body layers 33f, 33g having a nonmagnetic body layer 33h therebetween is equivalent to using a thick ferromagnetic body, and provides a strong shielding effect.

In this embodiment, the first magnetic shield 33 is rotationally symmetrical about the optical axis 27. In this regard, by way of example, the first magnetic shield 33 in this embodiment includes an upturned-lip portion 33a (having an L-shaped elevational section) and a shallow "conical" part 33b connected to the L-shaped part 33a. The shallow conical part 33b actually has a 3-dimensional profile of a truncated cone, and has an "inner" (or "first axis-facing" as referred to in the claims) surface 33c that is conical.

By adjusting the magnetic-field parameters of the wafer-side projection lens 14 to integrate the magnetic field produced by the lens with the magnetic field produced by the first magnetic shield 33, aberrations are canceled that otherwise would occur if the first magnetic shield 33 were not axially symmetrical about the optical axis 27. Furthermore, third-order and fifth-order aberrations, for example, that ordinarily would not be cancelled even with the inner surface 33c of the first magnetic shield 33 being conical nevertheless can be cancelled by suitably adjusting the energization parameters of the wafer-side projection lens 14. Energization parameters include respective electrical energizations of the deflection coils 23–25.

A "shielding ratio" S (a measure of shield "strength") of a cylindrical magnetic shield, made of a ferromagnetic material, against a stray magnetic field is defined by the following Equation (1):

$$S = \mu t / 2R \qquad (1)$$

wherein t is the thickness of the magnetic shield, R is the inside diameter of the magnetic shield, and $\mu$ is the permeability of the magnetic shield.

Equation (1) indicates that, for a cylindrical magnetic shield, the shielding ratio S can be increased by decreasing the inside diameter R of the magnetic shield or by increasing either the thickness t or the permeability $\mu$ of the shield. But, as the inside diameter of the magnetic shield is reduced, increased eddy currents are created in the magnetic shield in response to the magnetic fields generated by deflector(s) (e.g., deflector coils 23–25) used to correct electromagnetic lens aberrations, etc. The eddy currents produce corresponding delays in the time constant of the deflector(s). Therefore, in this embodiment, the inside diameter (measured at the edge 33d) of the first magnetic shield 33 is slightly greater than the inside diameter of the ferrite stack 22. With such a configuration, the first magnetic shield 33 efficiently shields against stray magnetic fields without causing a delay in the time constant of the deflection coils 23–25.

The configuration of the first magnetic shield 33 described above also allows stray magnetic fields created between the wafer-side projection lens 14 and the wafer 15 to flow smoothly from the first magnetic shield 33 to the lower second vacuum wall 28. This effect provides further shielding against stray magnetic fields.

As shown in FIG. 3, the reticle-side projection lens 12 is disposed upstream of the wafer-side projection lens 14. FIG. 2 is an enlarged elevational section of the "upper" right portion of the reticle-side electromagnetic projection lens 12 and its vicinity. The reticle-side projection lens 12 comprises a magnetic pole 6 that is rotationally symmetrical about the axis 27 and has a "C" radial section opening toward the axis 27. The magnetic pole 6 is made of a ferromagnetic material such as Permalloy or soft iron. Conductive windings 13 are configured as a coil situated inside the magnetic pole 6. The magnetic pole 6 also serves as a magnetic shield that blocks inward incursion of external magnetic fields toward the axis.

Inward of the reticle-side projection lens 12 is situated a first ferrite stack 34 made of alternating rings of an insulator material 34a and of a ferrite material 34b. The rings are stacked in the "vertical" (axial) direction. The first ferrite stack 34 functions as a shield that blocks the deflection magnetic field produced by a first deflector coil 35 (described later) from leaking outward. The first deflector coil 35 is situated radially inwardly of the first ferrite stack 34 and serves to correct aberrations, etc., in the reticle-side projection lens 12. A second ferrite stack 36 is disposed upstream of the reticle-side projection lens 12, and comprises alternating rings made of an insulator material 36a and rings made of a ferrite material 36b stacked in the "vertical" (axial) direction. Inward of the second ferrite stack 36 is a second deflector coil 37 that also serves to correct aberrations, etc., in the reticle-side projection lens 12.

The upstream-facing surface of the second ferrite stack 36 and of the second deflection coil 37 are "covered" by an "upper" first vacuum wall 38 made of a material that is non-magnetic and non-metallic. A rotationally symmetrical "upper" second vacuum wall 39, extending "downward" in the figure (i.e., in the axial direction), is attached at the peripheral lower edge 38c of the upper first vacuum wall 38. Thus, the upper second vacuum wall 39 effectively extends over and "covers" the outside diameter of the reticle-side projection lens 12. The upper second vacuum wall 39 is made of a ferromagnetic material. The upstream-facing edge of the upper second vacuum wall 39 defines a ring-shaped gland (groove) 39a extending downward in the figure. The gland 39a is configured to receive an elastomeric O-ring 40 or analogous sealing member. The O-ring 40 forms a seal at the area of contact of the peripheral lower edge 38c of the upper first vacuum wall 38 with the upper second vacuum wall 39.

An upstream end of the tube-shaped liner tube 30 (that extends cylindrically in the optical-axis direction, or vertical direction in the figure) is attached circumferentially to the upper first vacuum wall 38 at an inner edge 38b of the upper first vacuum wall 38. Thus, the upstream end of the liner tube 30 is attached to the upper first vacuum wall 38 of the reticle-side projection lens 12, and the downstream end of the liner tube 30 is attached to the lower first vacuum wall 26 of the wafer-side projection lens 14. On the upstream end of the liner tube 30, the inner edge 38b of the upper first vacuum wall 38 defines a ring-shaped gland (groove) 38a in which is placed an elastomeric O-ring 41 or analogous sealing member. The O-ring 41 forms a seal between the inner edge 38b of the upper first vacuum wall 38 and the outer diameter of the upstream end of the liner tube 30.

The liner tube 30 desirably is configured as a cylinder having an axis that is coincident with the optical axis 27. Midway in an axial direction from the projection lens 12 to the projection lens 14, the liner tube defines a circular ledge 30a where the inside diameter of the liner tube 30 abruptly narrows. The ledge 30a supports the contrast aperture 18.

A reticle Z-position sensor (not shown, but known in the art) is disposed to direct a light beam (and receive a reflected light beam) at a shallow angle (grazing-incidence angle) downward (in the figure) from the surface of the reticle 10. The incident and reflected light beams propagate within a defined zone 42. The reflected beam is detected and processed in a manner yielding information concerning the axial height position of the reticle 10. Hence, the reticle-side Z-position sensor is a so-called "grazing-incidence"-type sensor.

The space situated radially inwardly from the reticle-side projection lens 12 is blocked magnetically by the magnetic pole 6 against external stray magnetic fields. Notwithstanding this blocking, the area between the reticle 10 and the upstream-facing surface of the reticle-side projection lens 12 is affected easily by stray magnetic fields (such as from the linear motors 11b of the reticle stage 11) because this area is outside the effective electromagnetic lens-effect range of the reticle-side projection lens 12. If the patterned beam were to be affected by a stray magnetic field, then the beam position on the sensitive surface of the wafer 15 would exhibit unwanted variation. Effects of stray magnetic fields can be suppressed by narrowing the gap between the reticle and the projection lens 12. (However, this approach has limitations because the gap still must allow for the zone 42 used by the light beam of the Z-position sensor.)

The magnitude of variation of the beam position is a function of the product of the field strength of the stray magnetic field and the axial distance from the downstream-facing surface of the reticle 10 to the location where the stray magnetic field is created. That is, the magnitude of the variation in beam position is proportional to that distance. Similar to the wafer-side projection lens 14, it is desirable to block incursion of stray magnetic fields from a region extending from the downstream-facing surface of the reticle 10 to the upstream-facing surface of the reticle-side projection lens 12. To such end, the FIG. 2 embodiment includes a second magnetic shield 43 fastened to the upper second vacuum wall 39.

The variation of beam position also is proportional to the axial distance from the downstream-facing surface of the reticle 10 to the location where a stray magnetic field is created. Hence, shielding against stray magnetic fields is desirable in this region without interfering with the zone 42 in which the beam of the Z-position sensor propagates. To such end, in this embodiment, the second magnetic shield 43 is disposed so that its upstream-facing surface is adjacent the zone 42 without actually being in the zone. I.e., the upstream-facing surface of the second magnetic shield 43 and the zone 42 are immediately adjacent to each other with a slight clearance therebetween.

Similar to the first magnetic shield 33, the second magnetic shield 43 desirably has a multilayer structure (not shown) that includes at least two layers of a ferromagnetic material with a layer of a non magnetic material sandwiched between them. Such a shield 43 works at least as well as using a thicker shield made only of a ferromagnetic shield material.

In this embodiment, the second magnetic shield 43 is rotationally symmetrical about the optical axis 27. More specifically, the second magnetic shield 43 comprises a cylindrical portion 43a and a conical portion 43b connected to the cylindrical portion 43a. The conical portion 43b actually is configured as a truncated cone. Hence, the "inner" (or "second axis-facing" as referred to in the claims) surface 43c of the second magnetic shield 43 (i.e., the surface inclined toward the optical axis 27) has a conical shape. By adjusting the parameters of the magnetic field generated by the projection lens 12 to integrate the lens field with the magnetic shield, it is possible to cancel aberrations that otherwise would occur if the magnetic shield were not axially symmetrical at least about the optical axis 27. Third-order and fifth-order aberrations that cannot be cancelled even with the inner surface 43c of the second magnetic shield 43 having a conical shape can be cancelled by adjusting the energization parameters of the reticle-side projection lens 12 (e.g., the energization parameters of the second deflection coil 37), including the second magnetic shield 43.

Also, as discussed above regarding the first magnetic shield 33, in this embodiment the inside diameter (at the inner edge 43e of the second magnetic shield 43) is slightly greater than the inside diameter of the second ferrite stack 36. With such a configuration, the second magnetic shield 43 efficiently shields against stray magnetic fields (e.g., from the linear motors 11b of the reticle stage 11) without causing any delay in the time constant of the second deflection coil 37.

By configuring and placing the second magnetic shield 43 as described above, stray magnetic fields created between the reticle 10 and the reticle-side projection lens 12 flow smoothly from the second magnetic shield 43 to the upper first vacuum wall 38, thereby preventing inward incursion of such fields.

Figure 4:
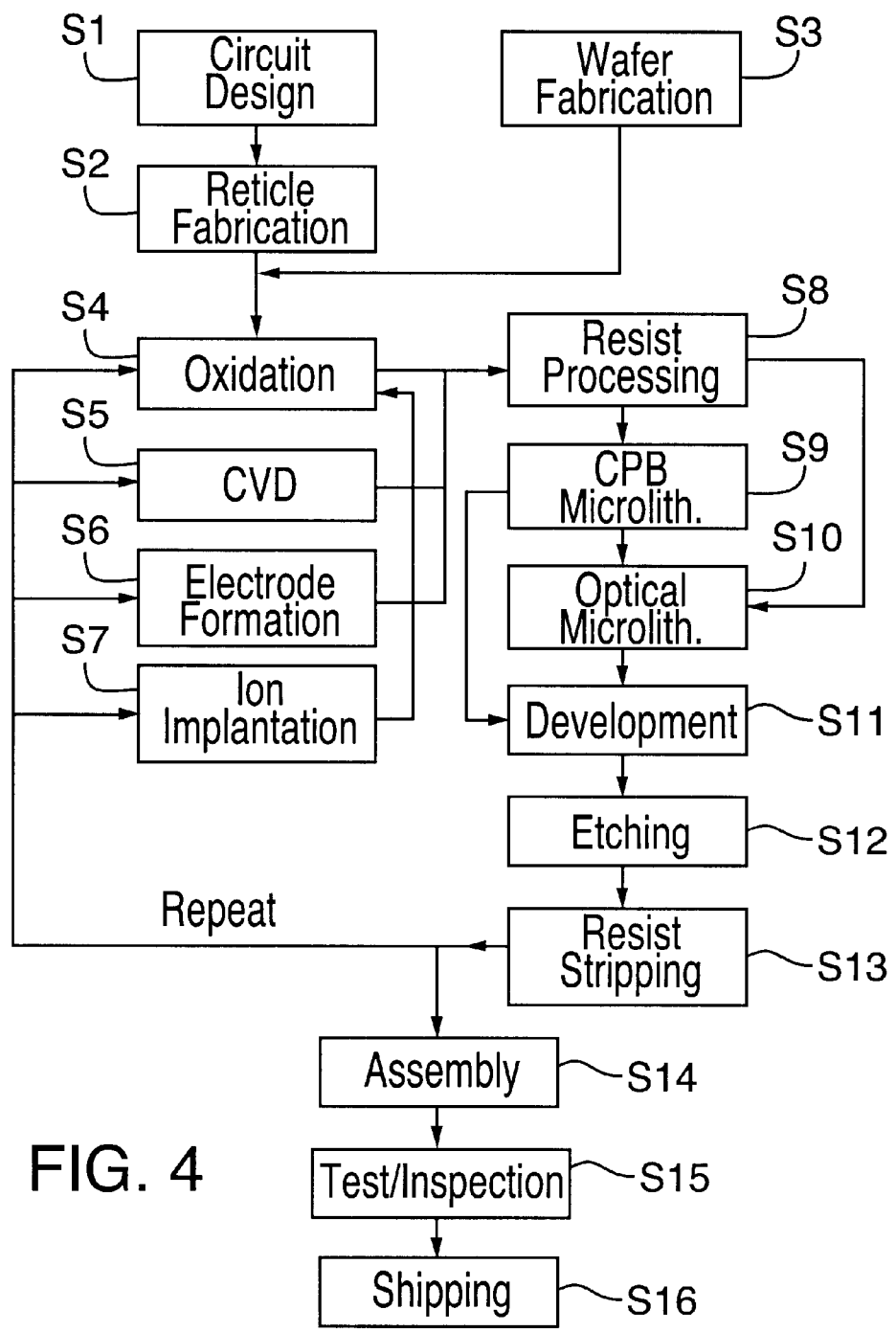
FIG. 4 is a flowchart of steps in a process for manufacturing a microelectronic device in the form of a semiconductor "chip" or the like, for example an integrated circuit, LSI, liquid-crystal panel, CCD, thin-film magnetic head, or micromachine.

FIG. 4 is a flowchart of steps in a process for manufacturing a microelectronic device such as a semiconductor chip (e.g., an integrated circuit or LSI device), a display panel (e.g., liquid-crystal panel), a charge-coupled device (CCD), a thin-film magnetic head, or a micro-machine, for example. In step S1, the circuit for the device is designed. In step S2, a reticle for a layer of the circuit is fabricated. During this step, local resizing of pattern elements can be performed to correct for, e.g., proximity effects and space-charge effects. In step S3, a wafer (or other suitable substrate) is fabricated from a material such as silicon.

Steps S4–S13 are directed to wafer-processing steps, also termed "pre-process" steps. In the pre-process steps, the circuit pattern defined on the reticle is transferred onto the wafer by microlithography. More specifically, step S4 is an oxidation step for oxidizing the surface of the wafer. Step S5 involves chemical vapor deposition (CVD) for forming an insulating layer on the wafer surface. Step S6 is an electrode-forming step for forming electrodes on the wafer (typically by vapor deposition). Step S7 is an ion-implantation step for implanting ions (e.g., dopant ions) into the wafer. Step S8 involves application of a resist (exposure-sensitive material) to the wafer. After the wafer is coated with the resist, the wafer is mounted to the surface of an electrostatic wafer chuck according to the invention, as described above. Step S9 involves exposing the resist-coated wafer using CPB microlithography so as to imprint the resist with the reticle pattern, as described elsewhere herein. Step S10 involves exposing the resist as required to a reticle pattern using optical microlithography. Either before or after the CPB microlithography step S9, an auxiliary exposure can be performed to correct for proximity effects from backscattered charged particles. Step S11 involves developing the exposed resist on the wafer. Step S12 involves etching the wafer to remove material from areas where developed resist is absent. Step S13 involves resist stripping, in which remaining resist on the wafer is removed after the etching step. By repeating steps S4–S13 as required, circuit patterns as defined by successive reticles are formed superposedly on the wafer.

Step S14 is an assembly step (also termed a "post-process" step) in which the wafer that has been passed through steps S4–S13 is formed into semiconductor chips. This step can include, e.g., assembling the devices (dicing and bonding) and packaging (encapsulation of individual chips). Step S15 is a testing and inspection step in which various operability and qualification tests of the device produced in step S14 are conducted. Afterward, in step S16, devices that successfully pass step S15 are finished, packaged, and shipped.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined in the appended claims.

What is claimed is:

1. A charged-particle-beam (CPB) microlithography apparatus, comprising:

an illumination-optical system situated on an optical axis and configured to illuminate a region of a reticle, defining a pattern to be transferred to a sensitive substrate, with a charged particle illumination beam;

a reticle stage situated and configured to hold the reticle as the reticle is being illuminated by the illumination-optical system, wherein charged particles of the illumination beam passing through the illuminated region of the reticle constitute a patterned beam;

an imaging-optical system situated on the optical axis and configured to receive the patterned beam and project a demagnified focused image, on a sensitive substrate, of the illuminated region of the reticle; and a substrate stage situated and configured to hold the substrate as the patterned beam is projecting the image onto the substrate;

the imaging-optical system comprising a reticle-side electromagnetic projection lens and a wafer-side electromagnetic projection lens situated axially downstream of the reticle-side projection lens, the wafer-side projection lens including a first magnetic shield having a first axis-facing surface that is rotationally symmetrical about the axis, the first magnetic shield being situated between a downstream-facing surface of the wafer-side projection lens and the substrate stage, wherein a space between the wafer-side projection lens and the substrate stage defines a zone in which a beam from a grazing-incidence-type substrate-height measurement device propagates to and from the substrate between the wafer-side projection lens and the substrate, and the first magnetic shield defines a downstream-facing surface that is situated adjacent to but outside the zone.

2. A charged-particle-beam (CPB) microlithography apparatus, comprising:

an illumination-optical system situated on an optical axis and configured to illuminate a region of a reticle, defining a pattern to be transferred to a sensitive substrate, with a charged particle illumination beam;

a reticle stage situated and configured to hold the reticle as the reticle is being illuminated by the illumination-optical system, wherein charged particles of the illumination beam passing through the illuminated region of the reticle constitute a patterned beam;

an imaging-optical system situated on the optical axis and configured to receive the patterned beam and project a demagnified focused image, on a sensitive substrate, of the illuminated region of the reticle; and a substrate stage situated and configured to hold the substrate as the patterned beam is projecting the image onto the substrate;

the imaging-optical system comprising a reticle-side electromagnetic projection lens and a wafer-side electromagnetic projection lens situated axially downstream of the reticle-side projection lens, the wafer-side projection lens including a first magnetic shield having a first axis-facing surface that is rotationally symmetrical about the axis, the first magnetic shield being situated between a downstream-facing surface of the wafer-side projection lens and the substrate stage;

a liner tube extending along the optical axis and having a downstream end;

a rotationally symmetrical lower first vacuum wall having an inside-diameter edge and a peripheral edge, the inside-diameter edge being attached circumferentially to the downstream end of the liner tube and extending radially between the wafer-side projection lens and the substrate stage; and a rotationally symmetrical lower second vacuum wall having a cylindrical body portion extending upstream in an axial direction outside the wafer-side projection lens and a downstream edge attached circumferentially to the peripheral edge of the lower first vacuum wall, wherein the first magnetic shield extends along a downstream-facing surface of the lower first vacuum wall from the peripheral edge toward the optical axis.

3. A charged-particle-beam (CPB) microlithography apparatus, comprising:

an illumination-optical system situated on an optical axis and configured to illuminate a region of a reticle, defining a pattern to be transferred to a sensitive substrate, with a charged particle illumination beam;

a reticle stage situated and configured to hold the reticle as the reticle is being illuminated by the illumination-optical system, wherein charged particles of the illumination beam passing through the illuminated region of the reticle constitute a patterned beam;

an imaging-optical system situated on the optical axis and configured to receive the patterned beam and project a demagnified focused image, on a sensitive substrate, of the illuminated region of the reticle; and a substrate stage situated and configured to hold the substrate as the patterned beam is projecting the image onto the substrate;

the imaging-optical system comprising a reticle-side electromagnetic projection lens and a wafer-side electromagnetic projection lens situated axially downstream of the reticle-side projection lens, the wafer-side projection lens including a first magnetic shield having a first axis-facing surface that is rotationally symmetrical about the axis, the first magnetic shield being situated between a downstream-facing surface of the wafer-side projection lens and the substrate stage;

at least one deflector situated radially inwardly of the wafer-side projection lens; and a cylindrical deflector shield extending in an axial direction between the at least one deflector and the wafer-side projection lens, wherein the first magnetic shield has an inside-diameter edge having a diameter that is larger than an inside diameter of the deflector shield.

4. The apparatus of claim 3, wherein the deflector shield is a ferrite stack.

5. A charged-particle-beam (CPB) microlithography apparatus, comprising:

an illumination-optical system situated on an optical axis and configured to illuminate a region of a reticle, defining a pattern to be transferred to a sensitive substrate, with a charged particle illumination beam;

a reticle stage situated and configured to hold the reticle as the reticle is being illuminated by the illumination-optical system, wherein charged particles of the illumination beam passing through the illuminated region of the reticle constitute a patterned beam;

an imaging-optical system situated on the optical axis and configured to receive the patterned beam and project a demagnified focused image, on a sensitive substrate, of the illuminated region of the reticle; and a substrate stage situated and configured to hold the substrate as the patterned beam is projecting the image onto the substrate;

the imaging-optical system comprising a reticle-side electromagnetic projection lens and a wafer-side electromagnetic projection lens situated axially downstream of the reticle-side projection lens, the wafer-side projection lens including a first magnetic shield having a first axis-facing surface that is rotationally symmetrical about the axis, the first magnetic shield being situated between a downstream-facing surface of the wafer-side projection lens and the substrate stage, wherein the first axis-facing surface is conical in profile, and the first magnetic shield has a multilayer structure including a non-magnetic body layer sandwiched between two ferromagnetic layers.

6. The apparatus of claim 1, wherein the reticle-side projection lens includes a second magnetic shield comprising a second axis-facing surface that is rotationally symmetrical about the optical axis, the second magnetic shield being situated between an upstream-facing surface of the reticle-side projection lens and the reticle.

7. A charged-particle-beam (CPB) microlithography apparatus, comprising:

an illumination-optical system situated on an optical axis and configured to illuminate a region of a reticle, defining a pattern to be transferred to a sensitive substrate, with a charged particle illumination beam;

a reticle stage situated and configured to hold the reticle as the reticle is being illuminated by the illumination-optical system, wherein charged particles of the illumination beam passing through the illuminated region of the reticle constitute a patterned beam;

an imaging-optical system situated on the optical axis and configured to receive the patterned beam and project a demagnified focused image, on a sensitive substrate, of the illuminated region of the reticle; and a substrate stage situated and configured to hold the substrate as the patterned beam is projecting the image onto the substrate;

the imaging-optical system comprising a reticle-side electromagnetic projection lens and a wafer-side electromagnetic projection lens situated axially downstream of the reticle-side projection lens, the wafer-side projection lens including a first magnetic shield having a first axis-facing surface that is rotationally symmetrical about the axis, the first magnetic shield being situated between a downstream-facing surface of the wafer-side projection lens and the substrate stage;

wherein the reticle-side projection lens includes a second magnetic shield comprising a second axis-facing surface that is rotationally symmetrical about the optical axis, the second magnetic shield being situated between an upstream-facing surface of the reticle-side projection lens and the reticle; a space between the reticle-side projection lens and the reticle defines a zone in which a beam from a grazing-incidence-type reticle-height measurement device propagates to and from the reticle between the reticle-side projection lens and the reticle; and the second magnetic shield defines an upstream-facing surface that is situated adjacent to but outside the zone.

8. A charged-particle-beam (CPB) microlithography apparatus, comprising:

an illumination-optical system situated on an optical axis and configured to illuminate a region of a reticle, defining a pattern to be transferred to a sensitive substrate, with a charged particle illumination beam;

a reticle stage situated and configured to hold the reticle as the reticle is being illuminated by the illumination-optical system, wherein charged particles of the illumination beam passing through the illuminated region of the reticle constitute a patterned beam;

an imaging-optical system situated on the optical axis and configured to receive the patterned beam and project a demagnified focused image, on a sensitive substrate, of the illuminated region of the reticle;

a substrate stage situated and configured to hold the substrate as the patterned beam is projecting the image onto the substrate; and a liner tube extending along the optical axis and having a downstream end;

the imaging-optical system comprising a reticle-side electromagnetic projection lens and a wafer-side electromagnetic projection lens situated axially downstream of the reticle-side projection lens, the wafer-side projection lens including a first magnetic shield having a first axis-facing surface that is rotationally symmetrical about the axis, the first magnetic shield being situated between a downstream-facing surface of the wafer-side projection lens and the substrate stage;

wherein the reticle-side projection lens includes a second magnetic shield comprising a second axis-facing surface that is rotationally symmetrical about the optical axis, the second magnetic shield being situated between an upstream-facing surface of the reticle-side projection lens and the reticle; the liner tube has an upstream end; the reticle-side projection lens further comprises a rotationally symmetrical upper first vacuum wall and a rotationally symmetrical upper second vacuum wall; the upper first vacuum wall includes an inside-diameter edge and a peripheral edge, the inside-diameter edge being attached circumferentially to the upstream end of the liner tube and extending between the reticle-side projection lens and the reticle; the upper second vacuum wall includes a cylindrical body portion extending downstream in an axial direction outside the reticle-side projection lens and an upstream edge attached circumferentially to the peripheral edge of the upper first vacuum wall; and the second magnetic shield extends along an upstream-facing surface of the upper first vacuum wall, from the peripheral edge toward the optical axis.

9. The apparatus of claim 6, further comprising:
a first deflector situated radially inwardly of the reticle-side projection lens; and
a cylindrical first deflector shield extending in an axial direction between the first deflector and the reticle-side projection lens.

10. The apparatus of claim 9, wherein the first deflector shield is a ferrite stack.

11. A charged-particle-beam (CPB) microlithography apparatus, comprising:
an illumination-optical system situated on an optical axis and configured to illuminate a region of a reticle, defining a pattern to be transferred to a sensitive substrate, with a charged particle illumination beam;
a reticle stage situated and configured to hold the reticle as the reticle is being illuminated by the illumination-optical system, wherein charged particles of the illumination beam passing through the illuminated region of the reticle constitute a patterned beam;
an imaging-optical system situated on the optical axis and configured to receive the patterned beam and project a demagnified focused image, on a sensitive substrate, of the illuminated region of the reticle; and
a substrate stage situated and configured to hold the substrate as the patterned beam is projecting the image onto the substrate;
the imaging-optical system comprising a reticle-side electromagnetic projection lens and a wafer-side electromagnetic projection lens situated axially downstream of the reticle-side projection lens, the reticle-side projection lens including a second magnetic shield comprising a second axis-facing surface that is rotationally symmetrical about the optical axis, the second magnetic shield being situated between an upstream-facing surface of the reticle-side projection lens and the reticle, and the wafer-side projection lens including a first magnetic shield having a first axis-facing surface that is rotationally symmetrical about the axis, the first magnetic shield being situated between a downstream-facing surface of the wafer-side projection lens and the substrate stage;
a first deflector situated radially inwardly of the reticle-side projection lens;
a cylindrical first deflector shield extending in an axial direction between the first deflector and the reticle-side projection lens;
a second deflector situated axially between the reticle and the first deflector; and
a cylindrical second deflector shield situated radially outside the second deflector and extending in the axial direction, wherein the second magnetic shield comprises an inside-diameter edge adjacent the second axis-facing surface, the inside-diameter edge having a diameter that is larger than an inside diameter of the second deflector shield.

12. The apparatus of claim 11, wherein the second deflector shield is a ferrite stack.

13. A charged-particle-beam (CPB) microlithography apparatus, comprising:
an illumination-optical system situated on an optical axis and configured to illuminate a region of a reticle, defining a pattern to be transferred to a sensitive substrate, with a charged particle illumination beam;
a reticle stage situated and configured to hold the reticle as the reticle is being illuminated by the illumination-optical system, wherein charged particles of the illumination beam passing through the illuminated region of the reticle constitute a patterned beam;
an imaging-optical system situated on the optical axis and configured to receive the patterned beam and project a demagnified focused image, on a sensitive substrate, of the illuminated region of the reticle; and
a substrate stage situated and configured to hold the substrate as the patterned beam is projecting the image onto the substrate;
the imaging-optical system comprising a reticle-side electromagnetic projection lens and a wafer-side electromagnetic projection lens situated axially downstream of the reticle-side projection lens, the reticle-side projection lens including a second magnetic shield comprising a second axis-facing surface that is rotationally symmetrical about the optical axis, the second magnetic shield being situated between an upstream-facing surface of the reticle-side projection lens and the reticle, and the wafer-side projection lens including a first magnetic shield having a first axis-facing surface that is rotationally symmetrical about the axis, the first magnetic shield being situated between a downstream-facing surface of the wafer-side projection lens and the substrate stage;
a second deflector situated radially inward of the reticle-side projection lens; and
a cylindrical second deflector shield extending in an axial direction between the second deflector and the reticle-side projection lens, wherein the second magnetic shield comprises an inside-diameter edge adjacent the second axis-facing surface, the inside-diameter edge having a diameter that is larger than an inside diameter of the second deflector shield.

14. A charged-particle-beam (CPB) microlithography apparatus, comprising:
an illumination-optical system situated on an optical axis and configured to illuminate a region of a reticle, defining a pattern to be transferred to a sensitive substrate, with a charged particle illumination beam;
a reticle stage situated and configured to hold the reticle as the reticle is being illuminated by the illumination-optical system, wherein charged particles of the illumination beam passing through the illuminated region of the reticle constitute a patterned beam;

an imaging-optical system situated on the optical axis and configured to receive the patterned beam and project a demagnified focused image, on a sensitive substrate, of the illuminated region of the reticle; and a substrate stage situated and configured to hold the substrate as the patterned beam is projecting the image onto the substrate;

the imaging-optical system comprising a reticle-side electromagnetic projection lens and a wafer-side electromagnetic projection lens situated axially downstream of the reticle-side projection lens, the reticle-side projection lens including a second magnetic shield comprising a second axis-facing surface that is rotationally symmetrical about the optical axis, the second magnetic shield being situated between an upstream-facing surface of the reticle-side projection lens and the reticle, and the wafer-side projection lens including a first magnetic shield having a first axis-facing surface that is rotationally symmetrical about the axis, the first magnetic shield being situated between a downstream-facing surface of the wafer-side projection lens and the substrate stage;

wherein the second magnetic shield has a multilayer structure including a non-magnetic body layer sandwiched between two ferromagnetic layers.

15. A charged-particle-beam (CPB) microlithography apparatus, comprising:

an illumination-optical system situated on an optical axis and configured to illuminate a region of a reticle, defining a pattern to be transferred to a sensitive substrate, with a charged particle illumination beam;

a reticle stage situated and configured to hold the reticle as the reticle is being illuminated by the illumination-optical system, wherein charged particles of the illumination beam passing through the illuminated region of the reticle constitute a patterned beam;

an imaging-optical system situated on the optical axis and configured to receive the patterned beam and project a demagnified focused image, on a sensitive substrate, of the illuminated region of the reticle; and a substrate stage situated and configured to hold the substrate as the patterned beam is projecting the image onto the substrate;

the imaging-optical system comprising a reticle-side electromagnetic projection lens and a wafer-side electromagnetic projection lens situated axially downstream of the reticle-side projection lens, the reticle-side projection lens including a second magnetic shield comprising a second axis-facing surface that is rotationally symmetrical about the optical axis, the second magnetic shield being situated between an upstream-facing surface of the reticle-side projection lens and the reticle, and the wafer-side projection lens including a first magnetic shield having a first axis-facing surface that is rotationally symmetrical about the axis, the first magnetic shield being situated between a downstream-facing surface of the wafer-side projection lens and the substrate stage;

wherein the second axis-facing surface is conical in profile.

16. A charged-particle-beam (CPB) microlithography apparatus, comprising:

an illumination-optical system situated on an optical axis and configured to illuminate a region of a reticle, defining a pattern to be transferred to a sensitive substrate, with a charged particle illumination beam;

a reticle stage situated and configured to hold the reticle as the reticle is being illuminated by the illumination-optical system, wherein charged particles of the illumination beam passing through the illuminated region of the reticle constitute a patterned beam;

an imaging-optical system situated on the optical axis and configured to receive the patterned beam and project a demagnified focused image, on a sensitive substrate, of the illuminated region of the reticle; and a substrate stage situated and configured to hold the substrate as the patterned beam is projecting the image onto the substrate;

the imaging-optical system comprising a reticle-side electromagnetic projection lens and a wafer-side electromagnetic projection lens situated axially downstream of the reticle-side projection lens, the reticle-side projection lens including a second magnetic shield comprising a second axis-facing surface that is rotationally symmetrical about the optical axis, the second magnetic shield being situated between an upstream-facing surface of the reticle-side projection lens and the reticle;

wherein a space between the reticle-side projection lens and the reticle defines a zone in which a beam from a grazing-incidence-type reticle-height measurement device propagates to and from the reticle between the reticle-side projection lens and the reticle, and the second magnetic shield defines an upstream-facing surface that is situated adjacent to but outside the zone.

17. A charged-particle-beam (CPB) microlithography apparatus, comprising:

an illumination-optical system situated on an optical axis and configured to illuminate a region of a reticle, defining a pattern to be transferred to a sensitive substrate, with a charged particle illumination beam;

a reticle stage situated and configured to hold the reticle as the reticle is being illuminated by the illumination-optical system, wherein charged particles of the illumination beam passing through the illuminated region of the reticle constitute a patterned beam;

an imaging-optical system situated on the optical axis and configured to receive the patterned beam and project a demagnified focused image, on a sensitive substrate, of the illuminated region of the reticle;

a substrate stage situated and configured to hold the substrate as the patterned beam is projecting the image onto the substrate;

the imaging-optical system comprising a reticle-side electromagnetic projection lens and a wafer-side electromagnetic projection lens situated axially downstream of the reticle-side projection lens, the reticle-side projection lens including a second magnetic shield comprising a second axis-facing surface that is rotationally symmetrical about the optical axis, the second magnetic shield being situated between an upstream-facing surface of the reticle-side projection lens and the reticle;

a liner tube extending along the optical axis and having an upstream end;

a rotationally symmetrical upper first vacuum wall having an inside-diameter edge and a peripheral edge, the inside-diameter edge being attached circumferentially to the upstream end of the liner tube and extending between the reticle-side projection lens and the reticle; and a rotationally symmetrical upper second vacuum wall having a cylindrical body portion extending downstream in an axial direction outside the reticle-side projection lens and an upstream edge attached circumferentially to the peripheral edge of the upper first vacuum wall, wherein the second magnetic shield extends along an upstream-facing surface of the upper first vacuum wall from the peripheral edge toward the optical axis.

18. The apparatus of claim 16, further comprising:

a first deflector situated radially inwardly of the reticle-side projection lens; and a cylindrical first deflector shield extending in an axial direction between the first deflector and the reticle-side projection lens.

19. A charged-particle-beam (CPB) microlithography apparatus, comprising:

an illumination-optical system situated on an optical axis and configured to illuminate a region of a reticle, defining a pattern to be transferred to a sensitive substrate, with a charged particle illumination beam;

a reticle stage situated and configured to hold the reticle as the reticle is being illuminated by the illumination-optical system, wherein charged particles of the illumination beam passing through the illuminated region of the reticle constitute a patterned beam;

an imaging-optical system situated on the optical axis and configured to receive the patterned beam and project a demagnified focused image, on a sensitive substrate, of the illuminated region of the reticle;

a substrate stage situated and configured to hold the substrate as the patterned beam is projecting the image onto the substrate;

the imaging-optical system comprising a reticle-side electromagnetic projection lens and a wafer-side electromagnetic projection lens situated axially downstream of the reticle-side projection lens, the reticle-side projection lens including a second magnetic shield comprising a second axis-facing surface that is rotationally symmetrical about the optical axis, the second magnetic shield being situated between an upstream-facing surface of the reticle-side projection lens and the reticle;

a first deflector situated radially inwardly of the reticle-side projection lens;

a cylindrical first deflector shield extending in an axial direction between the first deflector and the reticle-side projection lens a second deflector situated axially between the reticle and the first deflector; and a cylindrical second deflector shield situated radially outside the second deflector and extending in the axial direction, wherein the second magnetic shield comprises an inside-diameter edge adjacent the second axis-facing surface, the inside-diameter edge having a diameter that is larger than an inside diameter of the second deflector shield.

20. A charged-particle-beam (CPB) microlithography apparatus, comprising:

an illumination-optical system situated on an optical axis and configured to illuminate a region of a reticle, defining a pattern to be transferred to a sensitive substrate, with a charged particle illumination beam;

a reticle stage situated and configured to hold the reticle as the reticle is being illuminated by the illumination-optical system, wherein charged particles of the illumination beam passing through the illuminated region of the reticle constitute a patterned beam;

an imaging-optical system situated on the optical axis and configured to receive the patterned beam and project a demagnified focused image, on a sensitive substrate, of the illuminated region of the reticle;

a substrate stage situated and configured to hold the substrate as the patterned beam is projecting the image onto the substrate;

the imaging-optical system comprising a reticle-side electromagnetic projection lens and a wafer-side electromagnetic projection lens situated axially downstream of the reticle-side projection lens, the reticle-side projection lens including a second magnetic shield comprising a second axis-facing surface that is rotationally symmetrical about the optical axis, the second magnetic shield being situated between an upstream-facing surface of the reticle-side projection lens and the reticle;

a second deflector situated radially inwardly of the reticle-side projection lens; and a cylindrical second deflector shield extending in an axial direction between the second deflector and the reticle-side projection lens, wherein the second magnetic shield comprises an inside-diameter edge adjacent the second axis-facing surface, the inside-diameter edge having a diameter that is larger than an inside diameter of the second deflector shield.

21. The apparatus of claim 20, wherein the second deflector shield is a ferrite stack.

22. A charged-particle-beam (CPB) microlithography apparatus, comprising:

an illumination-optical system situated on an optical axis and configured to illuminate a region of a reticle, defining a pattern to be transferred to a sensitive substrate, with a charged particle illumination beam;

a reticle stage situated and configured to hold the reticle as the reticle is being illuminated by the illumination-optical system, wherein charged particles of the illumination beam passing through the illuminated region of the reticle constitute a patterned beam;

an imaging-optical system situated on the optical axis and configured to receive the patterned beam and project a demagnified focused image, on a sensitive substrate, of the illuminated region of the reticle;

a substrate stage situated and configured to hold the substrate as the patterned beam is projecting the image onto the substrate;

the imaging-optical system comprising a reticle-side electromagnetic projection lens and a wafer-side electromagnetic projection lens situated axially downstream of the reticle-side projection lens, the reticle-side projection lens including a second magnetic shield comprising a second axis-facing surface that is rotationally symmetrical about the optical axis, the second magnetic shield being situated between an upstream-facing surface of the reticle-side projection lens and the reticle;

wherein the second axis-facing surface is conical in profile; and the second magnetic shield has a multilayer structure including a non-magnetic body layer sandwiched between two ferromagnetic layers.

23. A process for manufacturing a microelectronic device, comprising the steps of:
   (a) preparing a wafer;
   (b) processing the wafer; and
   (c) assembling devices formed on the wafer during steps (a) and (b), wherein step (b) comprises the steps of (i) applying a resist to the wafer; (ii) exposing the resist; and (iii) developing the resist, and step (ii) comprises providing a CPB microlithography apparatus as recited in claim 1, and using the CPB microlithography apparatus to expose the resist with the pattern defined on the reticle.

24. A microelectronic device produced by the method of claim 23.

25. A process for manufacturing a microelectronic device, comprising the steps of:
   (a) preparing a wafer;
   (b) processing the wafer; and
   (c) assembling devices formed on the wafer during steps (a) and (b), wherein step (b) comprises the steps of (i) applying a resist to the wafer; (ii) exposing the resist; and (iii) developing the resist, and step (ii) comprises providing a CPB microlithography apparatus as recited in claim 17, and using the CPB microlithography apparatus to expose the resist with the pattern defined on the reticle.

26. A microelectronic device produced by the method of claim 25.

* * * * *

UNITED STATES PATENT AND TRADEMARK OFFICE
CERTIFICATE OF CORRECTION

PATENT NO. : 6,608,317 B1
DATED : August 19, 2003
INVENTOR(S) : Mamoru Nakasuji

It is certified that error appears in the above-identified patent and that said Letters Patent is hereby corrected as shown below:

Column 5,
Line 4, "prevent" should be -- preventing --.

Column 6,
Line 62, "on region" should be -- on a region --.

Column 7,
Line 46, "is" should be -- are --.

Column 8,
Line 21, "28aconfigured" should be -- 28a configured --.

Column 21,
Line 54, "lens" should be -- lens; --.

Signed and Sealed this

Second Day of March, 2004

JON W. DUDAS
*Acting Director of the United States Patent and Trademark Office*